(12) United States Patent
Spanard

(10) Patent No.: US 9,634,199 B2
(45) Date of Patent: Apr. 25, 2017

(54) METHODS OF TUNING LIGHT EMITTING DEVICES AND TUNED LIGHT EMITTING DEVICES

(71) Applicant: Jan-Marie Spanard, Newcomb, NY (US)

(72) Inventor: Jan-Marie Spanard, Newcomb, NY (US)

(*) Notice: Subject to any disclaimer, the term of this patent is extended or adjusted under 35 U.S.C. 154(b) by 0 days.

(21) Appl. No.: 14/776,767

(22) PCT Filed: Mar. 17, 2014

(86) PCT No.: PCT/US2014/030444
§ 371 (c)(1),
(2) Date: Sep. 15, 2015

(87) PCT Pub. No.: WO2014/145644
PCT Pub. Date: Sep. 18, 2014

(65) Prior Publication Data
US 2016/0035944 A1    Feb. 4, 2016

Related U.S. Application Data

(60) Provisional application No. 61/793,161, filed on Mar. 15, 2013.

(51) Int. Cl.
*H01L 33/00*     (2010.01)
*H01L 33/50*     (2010.01)
*F21K 9/64*      (2016.01)

(52) U.S. Cl.
CPC .............. *H01L 33/502* (2013.01); *F21K 9/64* (2016.08); *H01L 33/507* (2013.01); *H01L 2933/0041* (2013.01)

(58) Field of Classification Search
CPC ................ H01L 33/502; H01L 33/507; H01L 2933/0041; F21K 9/56
(Continued)

(56) References Cited

U.S. PATENT DOCUMENTS 6,066,861 A * 5/2000 Hohn ................. C09K 11/7718
                                          252/301.36
6,521,915 B2 * 2/2003 Odaki ................ C09K 11/7731
                                          257/100
(Continued)

OTHER PUBLICATIONS

International Search Report for PCT/US2014/030444 dated Oct. 14, 2014.
(Continued)

*Primary Examiner* — Xinning Niu
*Assistant Examiner* — Vu A Vu
(74) *Attorney, Agent, or Firm* — Heslin Rothenberg Farley & Mesiti, PC; Kristian E. Ziegler, Esq.

(57) ABSTRACT

Methods of treating an emission spectrum of visible light emitted from a light emitting source, and resulting apparatus, are disclosed. The methods include obtaining the visible light emission spectrum emitted from the light emitting source and a desired visible light emission spectrum. The methods may also include determining at least one wavelength of the emission spectrum of the source with an irradiance or intensity that is less than that of the desired emission spectrum. The methods may include selecting at least one pigment that is effective in tuning the emission spectrum of the source by increasing the intensity or irradiance of the at least one wavelength. The methods may include applying the at least one pigment to the light emitting source to treat the emission spectrum emitted therefrom.

20 Claims, 8 Drawing Sheets

WAVELENGTH (NANOMETERS)

(58) Field of Classification Search
USPC ............................................. 257/103
See application file for complete search history.

(56) References Cited

U.S. PATENT DOCUMENTS

| | | | |
|---|---|---|---|
| 2005/0127833 A1* | 6/2005 | Tieszen ................. | H01L 33/56 |
| | | | 313/512 |
| 2006/0016960 A1 | 1/2006 | Morgan et al. | |
| 2006/0022582 A1* | 2/2006 | Radkov ............... | C09K 11/665 |
| | | | 313/503 |
| 2010/0172122 A1 | 7/2010 | Ramer et al. | |
| 2012/0068204 A1 | 3/2012 | Pachler | |
| 2013/0128193 A1* | 5/2013 | Yang ................. | G02F 1/133502 |
| | | | 349/106 |
| 2013/0286324 A1* | 10/2013 | Huang ............. | G02F 1/133605 |
| | | | 349/61 |

OTHER PUBLICATIONS

Sep. 15, 2015: International Report on Patentability for International Application No. PCT/US2014/030444.

* cited by examiner

METHODS OF TUNING LIGHT EMITTING DEVICES AND TUNED LIGHT EMITTING DEVICES

CROSS-REFERENCE TO RELATED APPLICATION

The present application is a U.S. national phase applicaton of International PCT Patent Application No. PCT/US2014/030444, filed Mar. 17, 2014, which perfected U.S. Provisional Application Ser. No. 61/793,161, filed Mar. 15, 2013, which are hereby incorporated herein by this reference in their entirety, and the benefit of their filing date is hereby claimed.

FIELD OF THE INVENTION

The present invention generally relates to the field of treating light emitting devices or lamps, and, in particular, to tuning light emission spectrum with pigments and related apparatus.

BACKGROUND INFORMATION

Light emitting devices, such as incandescent devices, florescent devices, high intensity discharge, and light-emitting diode(s) (LED) devices all have different visual light emission spectrum or spectra—the spectrum of frequencies of electromagnetic radiation in the visible range emitted from the particular light emitting device—as shown in FIG. 1. For example, while LED light devices have the distinct economic advantages of using less energy and lasting many years longer than a traditional incandescent light device, the aesthetic quality of the light emitted from an LED device is less pleasing to the eye than the traditional incandescent device. Traditional incandescent devices, on the other hand, emit a more full color spectrum that, when viewed by consumers, is perceived as an aesthetically pleasing as it is closer to "white" light. White light is simply the color the human eye sees when it looks at light which substantially contains all the wavelengths of the visible spectrum. Such white light stimulates all three types of color sensitive cone cells in the human eye in nearly equal amounts. White light has become the standard, expected, or gold standard of light for humans. For example, light emitting devices are typically graded in their ability to reproduce the colors of an object in comparison with a natural, or "perfect," light source that produces white light, like sunlight. When colors are viewed from a light source that includes an emission spectrum with missing or low irradiance of one or more wavelength (i.e., color), some colors may appear "unnatural." Because of the importance of white light, and since white light is the mixing of multiple wavelengths of light in the visible spectrum, there have arisen multiple techniques for characterization of light that relate to how humans interpret a particular light emitted form a light emitting device.

One technique for the characterization or grading of the spectrum of light emitted from light emitting devices is the color temperature, which provides an index to the "whiteness" of the white light. Correlated color temperature (CCT) is characterized in color reproduction fields according to the temperature in degrees Kelvin (K) of a black body radiator that radiates the same color light as the light in question. A cooler white light, similar to the light generated by commercial fluorescent lamps, has a higher CCT, whereas a warmer white light, similar to the light generated by residential incandescent lamps, has a lower CCT. Direct sunlight has a color temperature of about 4,874 K, while indirect sunlight has a white color temperature of about 6,774 K, and an incandescent device has a white color temperature of about 2854 K. A color image viewed at 3,000 K will have a relatively reddish tone, whereas the same color image viewed at 10,000 K will have a relatively bluish tone. All of this light may be referred to as "white," but it has varying spectral content.

A second term applied to identify the color of the light source regardless of its lighting level or lumen is the chromaticity of the light source. When the chromaticity of different light sources is equal, the color of the light from each light source appears the same to the eye regardless of the lighting level. Chromaticity is measured in coordinates based upon a standard developed by the Commission Internationale de l'Eclairage (CIE) in 1931. An example of such coordinates is shown in Table 1, which identifies the X, Y chromaticity coordinates for the listed white light sources. FIG. 1B graphically illustrates the color and wavelength of the emitted light represented by X,Y coordinates based upon the CIE 1931 Standard, and highlights the rather large coordinate space covered by what is generally called "white" light.

TABLE 1

White Points Defined in CIE 1931 Standard

| Name | X | Y | Color Temperature | Comments |
|---|---|---|---|---|
| A | 0.4476 | 0.4075 | 2854° K | Incandescent Light |
| B | 0.3840 | 0.3516 | 4874° K | Direct Sunlight |
| C | 0.3101 | 0.3162 | 6774° K | Indirect Sunlight |
| D5000 | 0.3457 | 0.3586 | 5000° K | Bright Incandescent Light |
| D6500 | 0.3127 | 0.3297 | 6504° K | "Natural" Daylight |
| E | 0.3333 | 0.3333 | 5500° K | Normalized Reference |

Another classification of white light involves its quality. In 1965 the CIE recommended a method for measuring the color rendering properties of light sources based on a test color sample method. In essence, this method involves the spectroradiometric measurement of the light source under test. This data is multiplied by the reflectance spectrums of eight color samples. The resulting spectrums are converted to tristimulus values based on the CIE 1931 standard observer. The shift of these values with respect to a reference light are determined for the uniform color space (UCS) recommended in 1960 by the CIE. The average of the eight color shifts is calculated to generate the general color rendering index, known as CRI.

The color rendering index (CRI), sometimes called color rendition index, is a quantitative measure of the ability of a light source to reveal the colors of various objects faithfully in comparison with an ideal or natural light source, like sunlight—white light. In general terms, CRI is a measure of a light source's ability to show object colors "realistically" or "naturally" compared to a familiar reference source, either incandescent light or daylight. Numerically, the highest possible CRI is 100, for a Black body, dropping to negative values for some light sources. Because sunlight possesses every wavelength of visible light, it has a CRI of 100. A lower CRI means that the light source has a lower number of wavelengths of visible light. Low-pressure sodium lighting has negative CRI; fluorescent lights range from about 50 for the basic types, up to about 90 for the best tri-phosphor type. Typical LEDs have about an 80 CRI value.

CRI is calculated from the differences in the chromaticities of eight CIE standard color samples (CIE 1995) when illuminated by a light source and by a reference illuminant of the same correlated color temperature (CCT); the smaller the average difference in chromaticities, the higher the CRI. A CRI of 100 represents the maximum value. Lower CRI values indicate that some colors may appear unnatural when illuminated by the lamp. Within these calculations the CRI is scaled so that a perfect score equals 100, where perfect would be using a source spectrally equal to the reference source (often sunlight or full spectrum white light). For example a tungsten-halogen source compared to full spectrum white light might have a CRI of 99 while a warm white fluorescent lamp would have a CRI of 50. Of note, although prior art device techniques may achieve nearly "white" light, the missing red light wavelengths therein do not produce a light that is acceptable in all applications or for all consumers. For example, in some applications or for some consumers, such as those who value or rely on aesthetics and, in particular, color, the nearly "white light" emitted by prior art devices is simply insufficient or unacceptable.

Another technique for the characterization or grading of the spectrum of light emitted from light emitting devices is the color quality scale (CQS). CQS, which was developed by researchers at NIST Development of a Color Quality Scale, evaluates several aspects of the quality of the color of objects illuminated by a light emitting device. CQS involves several facets of color quality, including color rendering, chromatic discrimination, and observer preferences. More specifically, CQS is a quantitative measure of the ability of a light source to reproduce colors of illuminated objects. The output of this Color Quality Scale (CQS) is a composite score incorporating a light emitting device's ability to accurately render object colors, permit precise discrimination between different colors, and display object colors in a way that is visually pleasing to typical users (i.e., humans).

The method for calculating the CQS is derived from modifications to the method used in the CIE's color rendering index (CRI) discussed above. As discussed above, CRI is based on only eight reflective samples. The eight reflective samples are all relatively low to medium chromatic saturation. Some experts argue the eight reflective samples colors of the CRI do not adequately span the range of normal object colors. For example, some light emitting devices that are able to accurately render colors of low saturation perform poorly with highly saturated colors, particularly the peaked spectra of LEDs. Instead of the eight reflective samples of the CRI, the CQS utilizes fifteen Munsell samples to calculate the CQS. Further, the CQS factors in the root-mean-square (RMS) of all color shifts, rather than just averaging all of the samples like the CRI. The CQS also differs from the CRI in that the CRI penalizes light emitting devices for showing increases in object chromatic saturation compared to reference lights, which is actually desirable for most applications. To incorporate observer preference, the CQS differentiates between hue and saturation shifts and takes their directions into account.

The scales or measurements of the emission spectrum (i.e., color) of light emitting devices described above (and others) are needed because current light emitting devices fail at producing white light. With regards to LEDs, single or unitary "white light" LED chips currently do not exist. The most commonly used LED chips emit a cold blue light. The visual colors missing from the basic blue LED light spectrum are the red wavelengths. The diagram shown in FIG. 1 shows the spectrum of visible light emitted by natural daylight (sunlight) 11, LED light devices 13, traditional incandescent light devices 15, and compact florescent light devices 17. As shown by the arrow "R", LED light devices fail to produce red or deep red color light—wavelengths greater than about 600 nanometers to about 650 nanometers. Prior attempts to achieve an LED light device or lamp that produces white light, or nearly white light 1 (i.e., that warm the "cool" light created by LEDs), fall generally into two broad categories as illustrated in FIG. 3: (A) changing the color of the light emitted by the LED 19 through either the use of phosphor 21 or another luminescent or incandescent composition within the device (e.g., within the hood) (shown as "A" in FIG. 3); use of multiple color-mixed LEDs 19' within the device (shown as "B" in FIG. 3); and (3) changing the color of multiple color-mixed LEDs by doping the device envelope 25 (e.g., the hood) with phosphor or another luminescent or incandescent composition, or outside of the device hood via an outer substrate phosphor or another luminescent or incandescent composition.

Blended luminescent, incandescent or phosphor mechanisms (e.g., blended phosphor or other luminescent or incandescent coatings) are currently the dominant method of warming the naturally cool light of an LED chip to more closely mimic the white light emitted by an incandescent device or white light. As shown as "A" in FIG. 3, the single spectrum LED chip 19, which typically emits a dominant blue light (i.e., dominate blue wavelength), is covered or set behind a phosphor coating or member (or another luminescent or incandescent composition) 21 which substantially absorbs light emitted from the LED chip or die 19 and emits a warmer, broader light spectrum (e.g., "yellow" light/wavelengths). While the goal of the addition of phosphor to an LED chip is to produce white light, the phosphor typical adds only yellow tones and the LED is still missing, or has only a relatively small amount of, the red light array or wavelengths of the white light spectrum. Stated differently, the use of phosphor warms the light, but produces a slightly greenish-yellow colored light, and not truly white light. To the human eye, the resulting "white" light emitted by LED devices with luminescent, incandescent or phosphor mechanisms 21 is often describes as very sterile, harsh, and unnaturally "cold" light. However, the relative low cost of this technology and the general adequacy of the light color and quality make LED devices with luminescent or incandescent or phosphor mechanisms the most commonly used light-conditioning "solution" of LED light devices or lamps.

Current LED devices with luminescent or incandescent or phosphor mechanisms (e.g., a chemical phosphor or powdered mineral slurry applied to the LED device) include further drawbacks. For example, a drawback of current LED devices with luminescent or incandescent or phosphor mechanisms involves the delicate nature of the phosphor material. Phosphors are adversely affected by both heat, which the LEDs generate, and humidity. A phosphor disc, in which the phosphor is contained inside an enclosed plastic disc, is occasionally used as an attempt to help to alleviate these drawbacks. Yet another drawback of current LED devices with luminescent or incandescent or phosphor mechanisms is that they tend to not completely produce white light, as explained above. In essence, while the phosphor may provide the missing yellow spectrum of the light emitted by the LED diode chip, the phosphor fails to introduce red spectrum(s). Still another drawback of current LED devices with luminescent or incandescent or phosphor mechanisms involves the manufacturing process of such devices or lamps. Due to the extreme sensitivity of the chemicals and ratios used in the manufacture of a suitable blue LED base chip and phosphor, the smallest variance in these elements or the conditions under which they are applied, results in wildly varying shades of blue-white. This problem is so prevalent that production runs of "white" LEDs with phosphor must be sorted into multiple categories in order to provide the user with devices having relatively consistent optical outputs. However, even within a category, the tolerances are broadly applied because no two LED devices with luminescent or incandescent or phosphor mechanisms emit consistent light spectrum output.

As shown as "B" in FIG. 2, another alternative method of warming the naturally cool light of an LED light device to more closely mimic the white light emitted by an incandescent device is to utilize multiple LED chips or diodes of different colors 19'. For example, some devices or lamps include three or more separate LED chips of different colors 19' into one tri-chromatic or multi-chromatic device and "tune" them via mixing optics 23 to attempt to replicate white light. A blue LED chip, a green chip, a red chip, an amber chip, and so on are all packaged together to create a re-combined full spectrum of white light. Each individual chip output must be adjusted via mixing optics 23 in order to blend the various light colors into a white spectrum light. The most successful attempts with this process have used six or more different LED chips 19', each emitting a different wavelength of light, in order to more closely approximate natural light. The mechanics of this approach are often described with the analogy to recombining the light bands that are created when light passes through a prism.

Current LED devices with multiple LED chips or diodes 19' (e.g., embedding three or more different LED chips—one blue, one red, and one green—in a single device and "tuning" via mixing optics 23) to approximate white light include several drawbacks. Foremost, the inclusion of multiple LED chips 19' within a single device or lamp is relatively expensive, and often cost prohibitive. Another drawback of multiple chip or diode 19' LED devices is that they tend to produce a relatively large amount of heat. The heat output from three or more LED chips 19' is relatively greater than the heat output of one chip, thereby requiring different engineering of the device to adequately dissipate the heat to protect the chips. Yet another drawback of multiple chip or diode 19' LED devices is that tuning the multiple chips 19' via mixing optics 23 is relatively difficult and time consuming. Each individual chip must be tuned via mixing optics 23 and balanced to attempt to recreate the metameric effect of incandescent light.

As shown as "C" in FIG. 2, yet another alternative method of warming the naturally cool light of an LED device to more closely mimic the white light, or an incandescent spectrum, is to utilize a hybrid or combination of multiple LED color-mixed chips or diodes 19' with mixing optics 23 and luminescent or incandescent or phosphor 21. The hybrid approach attempts to draw strengths from each of the two methods "A" and "B" described above by using a combination of various discrete colored LEDs 19' via mixing optics 23 and luminescent or incandescent or phosphor 21. While this approach does a relatively good job of producing white light similar to incandescent devices, the approach includes several drawbacks that mirror the problems of each invention standing alone (as described above).

Unfortunately, the drawbacks of typical LED emission spectrums and tuning "solutions" thereof is not exclusive to LED light emitting devices. For example, as shown in FIG. 1, typical compact florescent light devices 17 produce an emission spectrum that includes a high irradiance of several narrow ranges of violets (e.g., wavelengths between about 375 nanometers and 400 nanometers) greens (e.g., wavelengths between about 500 nanometers and 550 nanometers) and oranges (e.g., wavelengths between about 600 nanometers and 625 nanometers). However, all other wavelengths in the visible spectrum of compact florescent light devices 17 may include relatively substantially low irradiance. Similarly, as also shown in FIG. 1, while incandescent includes a high irradiance of the "warm" colors (i.e., relatively high wavelengths, such as over 600 nanometers), they include low irradiance of "cool" colors (i.e., relatively low wavelengths). As such, all current light emitting devices produce emission spectrum that differs from white light (e.g., sunlight) that includes high irradiance of all of the wavelengths (i.e., colors) of the visible spectrum. As a result, current light emitting devices may benefit from tuning methods and resulting apparatus that alter the emission spectrum of the devices, such as modifying the emission spectrum (or at least a portion thereof) closer to that of white light. For example, tuning methods and resulting apparatus may increase the CRI and or CQS of a light emitting device. Further, because of varying user preferences or needs (e.g., aesthetic considerations), current light emitting devices may benefit from tuning methods and apparatus that can alter the emission spectrum to suit user preferences or needs. For example, emission spectrum tuning methods and resulting apparatus may advantageously tune one light emitting device such that the resulting emission spectrum is similar, or a least closer, to that of another light emitting device. As another example, emission spectrum tuning methods and resulting apparatus may advantageously tune a light emitting device to suit the particular "color" requirements of a particular use or desires of a particular user.

Accordingly, it is an object of the present invention to overcome one or more of the above-described drawbacks and/or disadvantages of the prior art while achieving these needs.

SUMMARY OF THE DISCLOSURE

In accordance with one aspect of the present disclosure, a method of tuning a first emission spectrum of visible light emitted from a light emitting source with a first luminosity, when energized, is disclosed. The method includes obtaining a first visible light emission spectrum emitted from a light emitting source including the intensity of wavelengths within the visible spectrum. The method further includes obtaining a desired second visible light emission spectrum including the intensity of wavelengths within the visible spectrum. The method further includes determining at least one first wavelength of the first visible light emission spectrum with an intensity less than the at least one wavelength in the second visible light emission spectrum. The method further includes selecting at least one pigment that substantially absorbs wavelengths within the visual spectrum and is effective in increasing the intensity of the at least one first wavelength. The method further includes applying the at least one pigment to the light emitting source in a first density that tunes the first emission spectrum of the light emitting source by increasing the intensity of the at least one first wavelength and decreasing the first luminosity by less than about 25%.

In accordance with another aspect of the present disclosure, an apparatus that, when energized, emits light is disclosed. The apparatus includes a light emitting device that emits light that, when energized, includes a first color rendering index (CRI) value and a first color quality scale (CQS) value. The apparatus further includes at least one pigment provided on the apparatus tuning the light emitted from the light emitting device such that light emitted from the apparatus includes a second CRI value that is greater than the first CRI value and a second CQS value that is greater than the first CQS value.

Other objects, aspects and advantages of the present disclosure, and/or of the embodiments thereof, will become more readily apparent in view of the following detailed description of the currently preferred embodiments and the accompanying drawings.

DETAILED DESCRIPTION OF PREFERRED EMBODIMENTS

Each embodiment presented below facilitates the explanation of certain aspects of the disclosure, and should not be interpreted as limiting the scope of the disclosure. Moreover, approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. When introducing elements of various embodiments, the articles "a," "an," "the," and "said" are intended to mean that there are one or more of the elements. The terms "comprising," "including," and "having" are intended to be inclusive and mean that there may be additional elements other than the listed elements. As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances, the modified term may sometimes not be appropriate, capable, or suitable. Any examples of operating parameters are not exclusive of other parameters of the disclosed embodiments. Components, aspects, features, configurations, arrangements, uses and the like described, illustrated or otherwise disclosed herein with respect to any particular embodiment may similarly be applied to any other embodiment disclosed herein.

Figure 4:
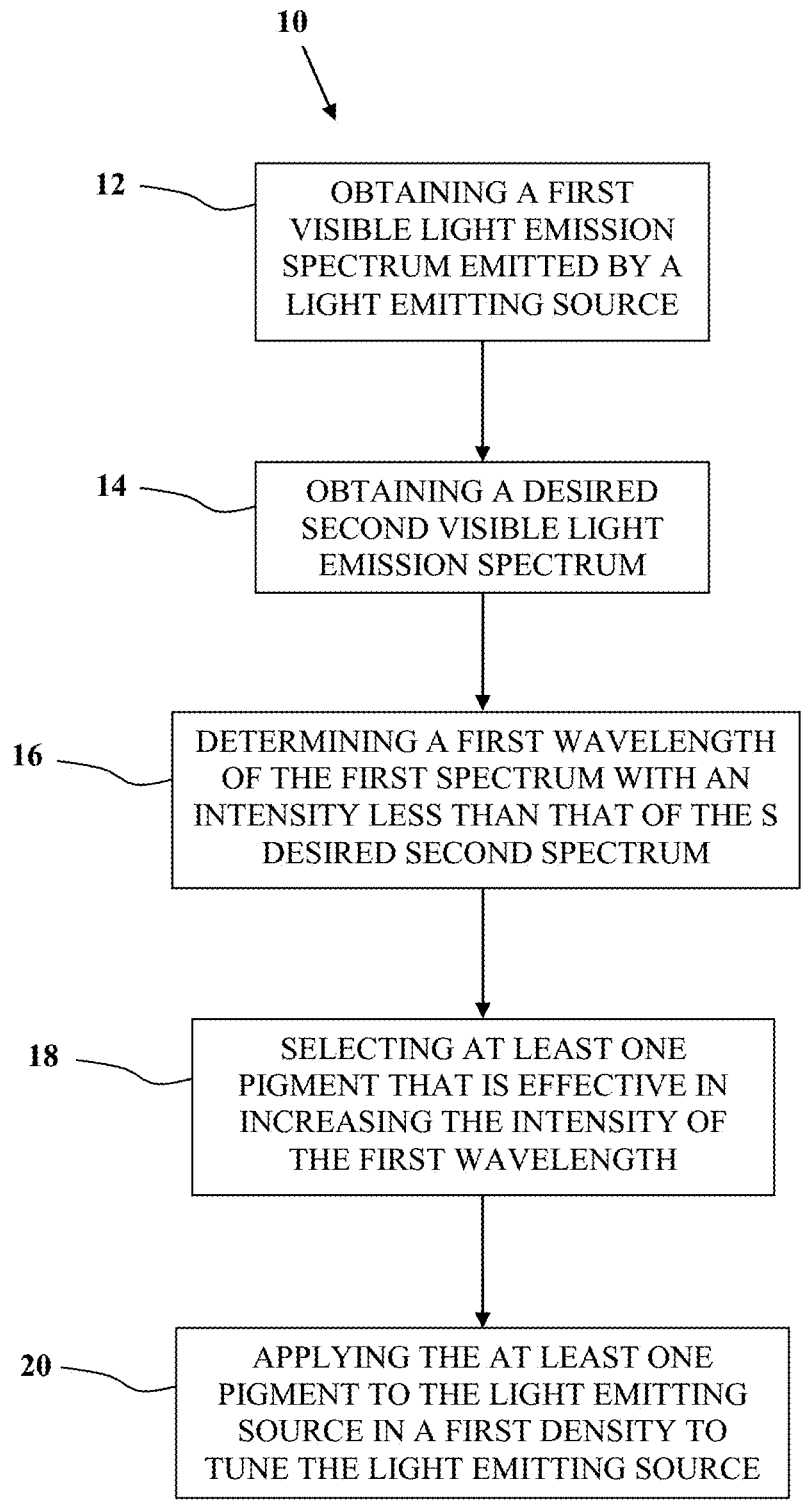
FIG. 4 is a flowchart illustrating an exemplary method of treating or tuning an emission spectrum of an exemplary light emitting device according to the present disclosure.

FIG. 4 shows a flowchart illustrating an exemplary method according to the present disclosure of treating or tuning a light emitting source by altering the visible light emission spectrum of the source generally referenced by numeral 10. In some embodiments, the method 10 may include tuning a first emission spectrum of visible light emitted from a light emitting source, when energized. In some embodiments the light emitting source may emit the visible light at a first luminosity. In some embodiments, the light emitting source may be any mechanism, device, apparatus, lamp, bulb, or the like effective in emitting visible light (i.e., wavelengths within the visible spectrum). In some embodiments, as discussed further below, the light emitting source may be at least a portion of a LED, such as a chip or die, or a chip or die and a luminescent or incandescent material (e.g., phosphorus). In some other embodiments, the light emitting source may be a CFL source, an incandescent source, a high intensity discharge source, or combinations thereof. It is noted that the methods and devices disclosed herein are particularly advantageous as they can be applied to any light source type, class, or configuration.

As shown in FIG. 4, the method 10 of tuning a light emitting source may include obtaining 12 a first visible light emission spectrum emitted by the light emitting source. In some embodiments, obtaining 12 the first visible light emission spectrum of the source may include obtaining the intensity or irradiance of at least some wavelengths of visible light emitted by the source when energized or powered. In some other embodiments, obtaining 12 the first visible light emission spectrum of the source may include obtaining the intensity or irradiance of each wavelength of radiated visible light emitted by the source when energized or powered. In some embodiments, obtaining 12 the first visible light emission spectrum of the source may include measuring each wavelength of radiated visible light emitted by the source with a spectral measurement device, such as a spectrometer, spectrophotometer, spectrograph or spectral analyzer. In some other embodiments, obtaining 12 the first visible light emission spectrum of the source may include obtaining information from a prior measurement (or measurements) of each wavelength of radiated visible light emitted by the source with a spectral measurement device. In some embodiments, the first visible light emission spectrum emitted by the light emitting source may be an undesired visible light emission spectrum.

In some embodiments, the method 10 of tuning a light emitting source may include obtaining 14 a desired second visible light emission spectrum, as shown in FIG. 4. In some such embodiments, obtaining 14 the desired second visible light emission spectrum may include obtaining a desired intensity or irradiance of at least some wavelengths within the visible spectrum. In some other embodiments, obtaining 14 the desired second visible light emission spectrum may include obtaining the intensity or irradiance of each wavelength of radiated visible light.

In some embodiments, the desired second visible light emission spectrum may be the visible light emission spectrum of a desired light emitting source differing from the first light emitting source. Stated differently, obtaining 14 a desired second visible light emission spectrum may include choosing a light source to mimic. For example, the first light emitting source may be a LED lamp, and the desired light emitting source may be an incandescent source. As another example, the first light emitting source may be a LED lamp, and the desired light emitting source may be daylight or sunshine (i.e., substantially white light). As yet another example, the first light emitting source may be a florescent source, and the desired light emitting source may be a high intensity discharge source. As yet another example, the first light emitting source may be a cool white LED lamp, and the desired light emitting source may be a warm white LED lamp. In some other embodiments, obtaining 14 a desired second visible light emission spectrum may include designing or choosing a visible light emission spectrum that is not available (such as with the particular type or class of light source) or economical. In some other embodiments, obtaining 14 a desired second visible light emission spectrum may include designing or choosing a visible light emission spectrum to suit a particular lighting need, such as an aesthetic lighting need.

In some embodiments, the desired second visible light emission spectrum may be white light. In some such embodiments, as described further below, the method 10 of tuning a light emitting source may include increasing the color rendering index (CRI) value and/or the color quality scale (CQS) value of the visible light emitted by the light emitting source.

As shown in FIG. 4, the method 10 of tuning a light emitting source may include determining 16 at least one first wavelength of the first visible light emission spectrum with an intensity or irradiance less than the at least one wavelength in the desired second visible light emission spectrum. In some embodiments, determining 16 at least one first wavelength of the first visible light emission spectrum with an intensity or irradiance that is less than the at least one wavelength in the desired second visible light emission spectrum may include comparing and/or contrasting (or otherwise analyzing) the first visible light emission spectrum and the desired second visible light emission spectrum. In some such embodiments, the comparing and/or contrasting may be performed visually by at least one operator. In some other such embodiments, the comparing and/or contrasting may be performed via a device, such as a computer. In some other such embodiments determining 16 at least one first wavelength of the first visible light emission spectrum with an intensity or irradiance less than the at least one wavelength in the desired second visible light emission spectrum may include obtaining the at least one first wavelength from records of previous analysis.

In some exemplary embodiments, determining 16 at least one first wavelength of the first visible light emission spectrum with an intensity or irradiance less than the at least one wavelength in the desired second visible light emission spectrum may include determining at least at least one range of wavelengths of the first visible light emission spectrum with an intensity or irradiance less than the least at least one range of wavelengths in the desired second visible light emission spectrum. In some exemplary embodiments, determining 16 at least one first wavelength of the first visible light emission spectrum with an intensity or irradiance less than the at least one wavelength in the desired second visible light emission spectrum may include determining at least at least two ranges of wavelengths of the first visible light emission spectrum with an intensity or irradiance less than the least at least two ranges of wavelengths in the desired second visible light emission spectrum. For example, in one exemplary embodiment the at least one first wavelength may be greater than about 620 nanometers.

Figure 5A:
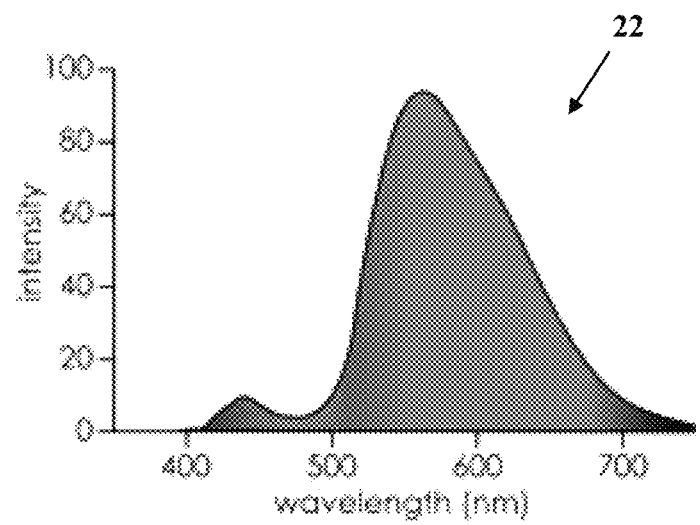
FIGS. 5A and 5B are exemplary embodiments of a first visible light emission spectrum of a light source and a desired second visible light emission spectrum, respectively, according to the method of treating or tuning an emission spectrum of FIG. 4.
Figure 5B:
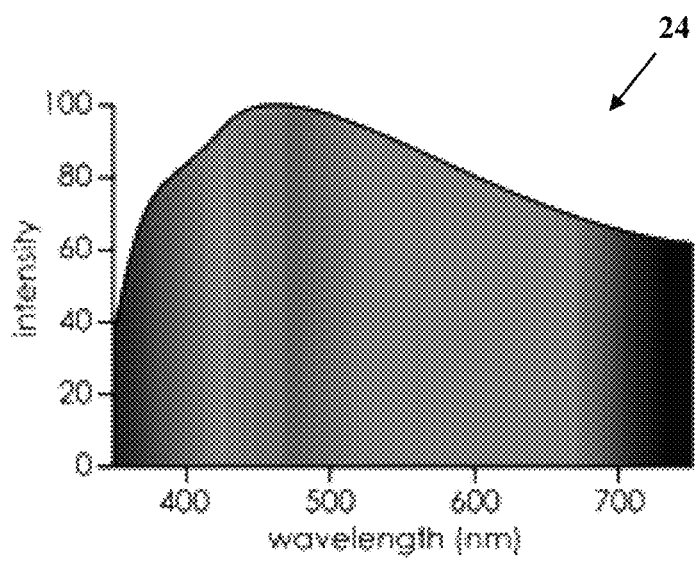

FIGS. 5A and 5B illustrate an exemplary first visible light emission spectrum 22 and a desired second visible light emission spectrum 24, respectively. In such an exemplary embodiment, the method 10 may include determining 16 at least one first wavelength of the first visible light emission spectrum 22 with an intensity or irradiance less than the at least one wavelength in the desired second visible light emission spectrum 24 may include determining that the ranges of wavelengths from about 380 nanometers to 550 nanometers, and from about 600 nanometers to about 750 nanometers, of the first visible light emission spectrum 22 are of a lesser intensity or irradiance than the ranges of wavelengths in the desired second visible light emission spectrum 24.

In some embodiments, the method 10 of tuning a light emitting source may include determining at least one second wavelength (or at least one range of wavelengths) of the first visible light emission spectrum with an intensity or irradiance greater than the at least one wavelength (or range at least one range of wavelengths) in the desired second visible light emission spectrum. For example, in one exemplary embodiment the at least one second wavelength may be less than about 620 nanometers. In some such embodiments, determining at least one second wavelength of the first visible light emission spectrum with an intensity or irradiance greater than the at least one wavelength in the desired second visible light emission spectrum may be accomplished or performed in the substantially same or similar way(s) as described above with respect to determining 16 at least one first wavelength of the first visible light emission spectrum with an intensity or irradiance less than the at least one wavelength in the desired second visible light emission spectrum.

As shown in FIG. 4, the method 10 of tuning a light emitting source may include selecting or determining 18 at least one pigment that is effective in increasing the intensity of the at least one first wavelength, such as when visible light is emitted onto, into, or through the at least one pigment. In some embodiments, selecting 18 at least one pigment that is effective in increasing the intensity of the first wavelength includes determining at least one pigment that substantially absorbs wavelengths within the visual spectrum and is effective in increasing the intensity of the at least one first wavelength. In some embodiments, the method 10 of tuning a light emitting source may include selecting 18 at least one pigment that is effective in increasing the intensity of the at least one first wavelength and/or decreasing the intensity of the at least one second wavelength.

In some embodiments, selecting 18 at least one pigment that is effective in increasing the intensity of the at least one first wavelength (and/or decreasing the intensity of the at least one second wavelength) may include converting the at least one first wavelength (at least one second wavelength) into colors. For example, in some exemplary embodiments wavelengths within the range of about 380 nanometers and about 425 nanometers may be considered as violet, wavelengths within the range of about 426 nanometers and about 460 nanometers may be considered as indigo, wavelengths within the range of about 461 nanometers and about 500 nanometers may be considered as blues, wavelengths within the range of about 501 nanometers and about 570 nanometers may be considered as greens, wavelengths within the range of about 571 nanometers and about 590 nanometers may be considered as yellows, wavelengths within the range of about 591 nanometers and about 640 nanometers may be considered as oranges, and wavelengths within the range of about 641 nanometers and about 730 nanometers may be considered as reds. However, in other embodiments the visible wavelengths may be categorized differently, and/or additional (or fewer) color categories may be utilized.

In some embodiments selecting 18 at least one pigment that is effective in increasing the intensity of the at least one first wavelength may include selecting at least one pigment that substantially absorbs the at least one first wavelength. For example, selecting 18 at least one pigment that is effective in increasing the intensity of the at least one first wavelength may include selecting at least one pigment of the color (or color category) associated with the at least one first wavelength. In some embodiments the method 10 may include selecting 18 at least one pigment that is effective in increasing the intensity of the at least one first range of wavelengths including selecting at least one pigment that substantially absorbs the at least one first range of wavelengths. In some embodiments the method 10 may include selecting 18 at least one pigment that is effective in increasing the intensity of at least two ranges of wavelengths including selecting at least one pigment that substantially absorbs light wavelengths within one of the at least two ranges of wavelengths, and a second a pigment that substantially absorbs light wavelengths within the other of the at least two ranges of wavelengths.

In some embodiments the method 10 may include selecting at least one pigment that is effective in decreasing the intensity of the at least one second wavelength. In some such embodiments, selecting at least one pigment that is effective in decreasing the intensity of the at least one second wavelength may include selecting at least one pigment that does not substantially absorbs (such as substantially reflects) the at least one second wavelength. For example, selecting at least one pigment that is effective in decreasing the intensity of the at least one second wavelength may include selecting at least one pigment of the color (or color category) associated with the at least one second wavelength. In some embodiments the method may include selecting at least one pigment that is effective in decreasing the intensity of the at least one second range of wavelengths including selecting at least one pigment that does not substantially absorb (such as substantially reflects) the at least one second range of wavelengths. In some embodiments the method 10 may include selecting at least one pigment that is effective in decreasing the intensity of at least two ranges of wavelengths including selecting at least one pigment that does not substantially absorb (such as substantially reflects) light wavelengths within one of the at least two ranges of wavelengths, and a second a pigment that does not substantially absorb (such as substantially reflects) light wavelengths within the other of the at least two ranges of wavelengths.

In some embodiments, selecting 18 at least one pigment that is effective in increasing the intensity of the at least one first wavelength may include selecting a mix of multiple pigments. For example, the at least one first wavelength may include several wavelengths, and the several wavelengths may vary in the intensity difference to the second desired emission spectrum. The relative intensity difference levels may be used to determine what % of different pigments may be selected. For example, in an exemplary embodiment that includes a "warm white" LED spectrum as the first spectrum and a day light (or sunshine) spectrum as the desired second spectrum, the at least one first wavelength may be several wavelengths and the corresponding selected mix of multiple pigments may be about 18% violet pigments, 15% indigo pigments, 17% blue pigments, 10% green pigments, 0% yellow pigments, 12% orange pigments, and 18% red pigments as categorized above in an exemplary embodiment.

In some embodiments, the at least one pigment may be any pigment. In some embodiments, the at least one pigment may be substantially heat-resistant within the normal operating temperatures of light emitting sources. In some embodiments, the at least one pigment may be substantially light-fast, transparent and brilliant in color. In some embodiments, the at least one pigment may include Keim Mineral Coatings, PEBEO Vitrea 160, PEBEO Vitrail, and Delta Glass Paints. In some embodiments, the at least one pigment may be a synthetic manmade pigment or an inorganic pigment. In some embodiments, the at least one pigment may be glass frit. In some embodiments, the at least one pigment may be synthetic resin. In some embodiments, the at least one pigment may be poly resin. In some embodiments, the at least one pigment may be an inorganic pigment. In some embodiments, the at least one pigment may be an inorganic earth pigment. In some embodiments, the at least one pigment may be an organic earth pigment. In some embodiments, the at least one pigment may be potassium silicate. In some embodiments, the at least one pigment may be garnet mica.

The particular color and amount of pigment(s) within the glaze or glazes utilized herein can be adjusted in the spectral range such that the particular light emitted by a light emitting source is changed or altered such that missing wavelengths of the light spectrum need to crate "white" light, or other spectra, are provided by the at least one pigment. In this way, the at least one pigment may depend, or at least be related to, the first light spectrum emitted by the light emitting source as compared to the desired second spectrum. In essence, the at least one pigment (and/or the amount thereof) may be adjusted to provide the missing wavelengths of the first light spectrum as compared to a desired second spectrum. In fact, any color scheme at all could be used for decorative purposes, creating a soft pink light for example. As another example, the at least one pigment may be a substantially brilliant glossy transparent tint, or a substantially opalescent, light-refracting tint of various complimentary warm yellow and red hues.

As shown in FIG. 4, in some embodiments the method 10 of tuning a light emitting source may include applying 20 the at least one pigment to the light emitting source in a first density to tune, as described above, the light emitting source. In some embodiments, applying 20 at least one pigment to the light emitting source in a first density to tune the light emitting source includes applying 20 at least one pigment to the light emitting source in a first density that tunes the first emission spectrum of the light emitting source by increasing the intensity of the at least one first wavelength. In some other embodiments, applying 20 at least one pigment to the light emitting source in a first density to tune the light emitting source includes applying 20 at least one pigment to the light emitting source in a first density that tunes the first emission spectrum of the light emitting source by increasing the intensity of the at least one first wavelength and decreasing the intensity of the at least one second wavelength.

In some embodiments, the method 10 of tuning a light emitting source may include applying 20 at least one pigment to the light emitting source in a first density that tunes the first emission spectrum of the light emitting source by increasing the intensity of the at least one first wavelength (and/or decreasing the intensity of the at least one second wavelength) and decreasing the first luminosity by less than about 25%. In some embodiments, the method 10 of tuning a light emitting source may include applying 20 at least one pigment to the light emitting source in a first density that tunes the first emission spectrum of the light emitting source by increasing the intensity of the at least one first wavelength (and/or decreasing the intensity of the at least one second wavelength) and decreasing the first luminosity by less than about 10%. In some embodiments, the method 10 of tuning a light emitting source may include applying 20 at least one pigment to the light emitting source in a first density that tunes the first emission spectrum of the light emitting source by increasing the intensity of the at least one first wavelength (and/or decreasing the intensity of the at least one second wavelength) and decreasing the first luminosity by less than about 5%.

In some embodiments, the method 10 may include determining an acceptable loss of luminosity of the light emitting source that that will result from the first density of the at least one pigment. For example, the first density of the at least one pigment may be adjusted from an "imperceptible to the human eye" transparency level, to a visible range of transparent-to-translucent saturation of color. In some embodiments, the greater the first density of the at least one pigment, the more the first emission spectrum with be toned or treated but the greater the loss of luminosity of the light source, or lumen output. As a result, in some embodiments the first density of the at least one pigment may depend upon the desired balance of the level of toning of the first emission spectrum and the level of lost luminosity.

Figure 1:
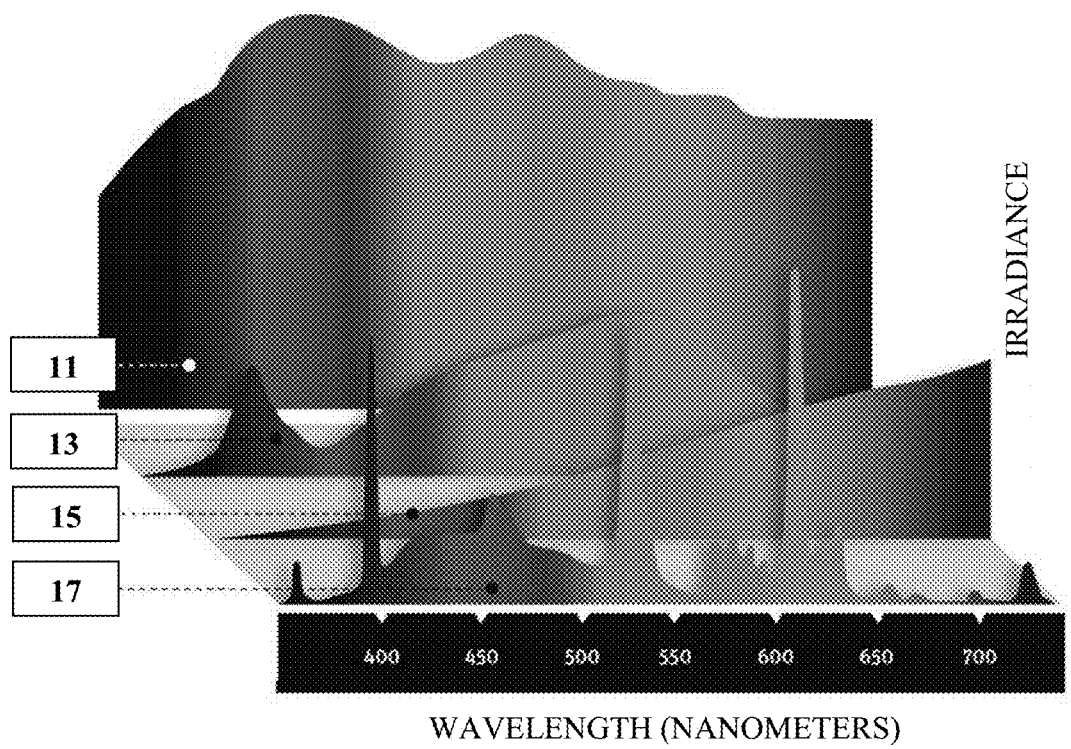
FIG. 1 is an illustration of the visible light spectrum (wavelengths) emitted by sunlight, typical LED devices, typical incandescent devices and typical CFL devices.
Figure 6:
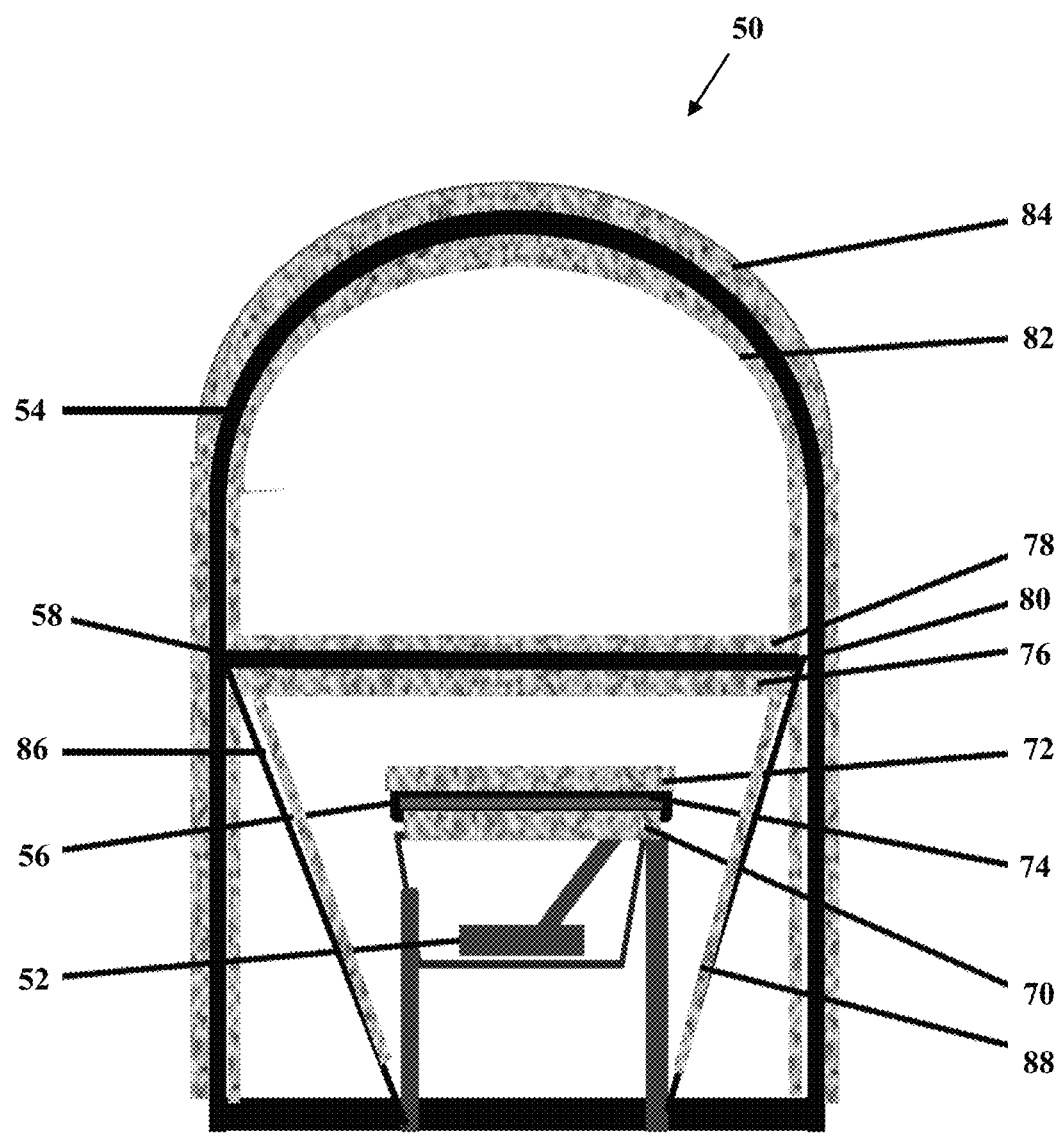
FIG. 6 illustrates a cross-sectional view of exemplary pigment applications on a LED light emitting device according to the method of treating or tuning an emission spectrum of FIG. 4.

As shown in FIGS. 6-8C, the at least one pigment may be applied to a light emitting source in a variety of configurations, arraignments, placements, and the like. As shown in FIG. 6, the at least one pigment may be applied to many different components or aspects of a solid state light emitting device, for example (however, as is known in the art, the same or similar arrangements of the pigment on the exemplary solid state light emitting source of FIG. 6 may apply to other types of light emitting sources). With reference to FIG. 6, applying 20 at least one pigment to the light emitting source may include applying the at least one pigment to a solid state light emitting source or device. In some exemplary embodiments, the solid state light emitting source of FIG. 6 is an LED lamp generally indicated by the reference numeral 50. With reference to FIG. 6, applying 20 at least one pigment to the light emitting source may include applying the at least one pigment to a solid state light emitting source or device. In some exemplary embodiments, the solid state light emitting source of FIG. 6 is an LED lamp generally indicated by the reference numeral 50. In some embodiments, as shown in FIG. 6, the LED lamp 50 includes at least one light emitting diode (LED) die or chip 52 housed inside of a light device dome or envelope 54. In some embodiments (not shown), more than one light emitting diode (LED) die or chip 52 may be contained within the envelope 54. The light emitting diode (LED) die or chip 52 may be any light emitting diode (LED) die or chip that emits light. As discussed above, typical LED chips 52 emit cold blue light that is missing red wavelengths (See FIG. 1). The exemplary LED lamp 50 further includes at least one luminescent or incandescent or phosphor mechanism 56 within the envelope 54 positioned such that at least a substantial portion of the light emitted by the LED chip 52 is projected into/onto the luminescent or incandescent or phosphor mechanism 56, as shown in FIG. 4. The luminescent or incandescent or phosphor mechanism 56 may be any luminescent or incandescent or phosphor mechanism 56 effective absorbing light emitted from the LED chip 52 and, ultimately, emitting light from the device 50. In this way, the at least chip 52 and/or the at least one mechanism 56 may emit or produce the first visible light emission spectrum emitted from the light emitting source 50.

As shown in FIG. 6, the at least one pigment may be applied to the LED chip 52 within the dome, hood or envelope 54. In some embodiments, the at least one pigment 70 may be applied to an interior or bottom surface of the luminescent or incandescent or phosphor mechanism 56 such that the at least one pigment 70 is positioned between the LED chip 52 and the mechanism 56, as shown in FIG. 6. In this way, light emitted from the LED chip 52 will interact with the at least one pigment 70 applied to an interior surface of the luminescent or incandescent or phosphor mechanism 56. In this way, the at least one pigment 70 may tune light emitted from the LED chip 52.

As another example, as shown in FIG. 6, in some embodiments the at least one pigment 72 may be applied to an exterior or top surface of the luminescent or incandescent or phosphor mechanism 56 that substantially opposing the interior surface thereof, such that the mechanism 56 is positioned between the LED chip 52 and the at least one pigment 70, as shown in FIG. 6. In this way, light emitted from the LED chip 52 will interact with the luminescent or incandescent or phosphor mechanism 56, and the luminescent or incandescent or phosphor mechanism 56 will absorb at least some of the emitted light. The luminescent or incandescent or phosphor mechanism 56 will then emit light and such light will interact with the at least one pigment 72 applied to an exterior surface thereof. In this way, the at least one pigment 70 may tune light emitted from the luminescent or incandescent or phosphor mechanism 56.

As another example, as shown in FIG. 6, in some embodiments the at least one pigment 74 may be provided in the luminescent or incandescent or phosphor mechanism 56. In this way, light emitted from the LED chip 52 will interact with the luminescent or incandescent or phosphor mechanism 56, and the luminescent or incandescent or phosphor mechanism 56 will absorb at least some of the emitted light. Light passing through the mechanism 56, if any, will then be tuned by the at least one pigment 74. Further, the luminescent or incandescent or phosphor mechanism 56 may emit light and such light will interact with the at least one pigment 72 provided or carried therein. In this way, the at least one pigment 70 may tune light emitted from the luminescent or incandescent or phosphor mechanism 56 and/or the chip 52.

The present disclosure provides an apparatus that, when energized, emits light. The apparatus may include a light emitting device that emits light that, when energized, includes a first color rendering index (CRI) value and a first color quality scale (CQS) value. The apparatus may include at least one pigment provided on the apparatus tuning the light emitted from the light emitting device such that light emitted from the apparatus includes a second CRI value that is greater than the first CRI value and a second CQS value that is greater than the first CQS value.

In some embodiments, the light emitted from the device includes a first luminosity, and wherein the at least one pigment reduces the first luminosity such that the light emitting device includes a second luminosity of at least 75% of the first luminosity. In some embodiments, the light emitted from the device includes a first luminosity, and the at least one pigment reduces the first luminosity such that the light emitting device includes a second luminosity of at least 85% of the first luminosity. In some embodiments, the light emitted from the device includes a first luminosity, and the at least one pigment reduces the first luminosity such that the light emitting device includes a second luminosity of at least 90% of the first luminosity. In some embodiments, the light emitted from the device includes a first luminosity, and the at least one pigment reduces the first luminosity such that the light emitting device includes a second luminosity of at least 95% of the first luminosity. In some embodiments, the light emitted from the light emitting device includes a first color spectrum, and the at least one pigment is configured such that the light emitted from the apparatus includes a second color spectrum that includes more light with wavelengths greater than about 550 nanometers than the first color spectrum. In some embodiments, the light emitted from the light emitting device includes a first color spectrum, and the at least one pigment is configured such that the light emitted from the apparatus includes a second color spectrum that includes more light with wavelengths greater than about 620 nanometers than the first color spectrum.

In some embodiments, the at least one pigment includes a pigment that substantially absorbs light wavelengths less than about 600 nanometers. In some embodiments, the at least one pigment includes multiple pigments that substantially absorb wavelengths of differing lengths. In some embodiments, the at least one pigment is within a binder. In some such embodiments, the binder is at least one of an acrylic polymer, a water-soluble binder medium, oil-based, resin-based, or more silicate and glass frit.

In some embodiments, the light emitting device is a solid state light emitting device. In some such embodiments, the solid state light emitting device includes a diode and a phosphor device or material, and at least one pigment is positioned at least one of: on an interior surface of the phosphor device or material such that the at least one pigment is positioned between the diode and the phosphor device or material; on an exterior surface of the phosphor device or material substantially opposing the interior surface thereof such that the phosphor device or material is positioned between the diode and the at least one pigment; and within the phosphor device or material. In some other embodiments, the solid state light emitting device includes a diode and an at least partially transparent envelope at least partially extending about the diode, and the at least one pigment is positioned at least one of: on an interior surface of the envelope such that the at least one pigment is positioned between the diode and the envelope; and on an exterior surface of the envelope substantially opposing the interior surface thereof such that the envelope is positioned between the diode and the at least one pigment. In some embodiments, the solid state light emitting device includes a diode and at least one reflector, and the at least one pigment is positioned on an interior surface of the reflector such that the at least one pigment is positioned between the diode and the reflector. In some embodiments, the solid state light emitting device includes a diode and at least one reflector, and wherein the at least one pigment is positioned on an interior surface of the reflector such that the at least one pigment is positioned between the diode and the reflector. In some embodiments, the solid state light emitting device includes a diode and at least one lens or filter, and the at least one pigment is positioned at least one of: on an interior surface of the at least one lens or filter such that the at least one pigment is positioned between the diode and the at least one lens or filter; on an exterior surface of the at least one lens or filter substantially opposing the interior surface thereof such that the at least one lens or filter is positioned between the diode and the at least one pigment; and within the at least one lens or filter.

In some embodiments, the apparatus includes an envelope including a first portion proximate a base or head of the apparatus and a second portion distal the base or head, and the at least one pigment is positioned on the envelope in differing densities in the first and second portions thereof. In some such embodiments, the at least one pigment graduates in density from a greater density in the first portion of the envelope to a lesser density in the second portion of the envelope. In some embodiments, the at least one pigment is a defined pattern of differing densities provided on the apparatus.

As another example, as shown in FIG. 6, in some embodiments at least one pigment 84 may be applied to an exterior surface of the dome or envelope 54 substantially opposing the interior surface thereof such that the dome or envelope 54 is positioned between the diode 52 and phosphorus 56 and the at least one pigment 84. In this way, the at least one pigment 84 may tune light emitted from the luminescent or incandescent or phosphor mechanism 56 and/or the chip 52 (or any other light emitting component within envelop 54) that passes through or around the dome or envelope 54 (or from the dome or envelope 54).

As another example, as shown in FIG. 6, in some embodiments the solid state light emitting device 50 includes at least one reflector 86. The at least one reflector 86 may be configured such that at least some of the spectrum emitted from the chip 52 and or the luminescent/incandescent/phosphor mechanism 56 (or any other component) interacts with and, potentially, reflects off the at least one reflector 86. In some such embodiments, at least one pigment 88 may be applied to the at least one reflector 86 such that the at least one pigment 88 is positioned between the luminescent or incandescent or phosphor mechanism 56 and/or the chip 52 (or any other light emitting component) and the at least one reflector 86. In this way, the at least one pigment 88 may tune light reflected by the reflector 86.

Figure 2:
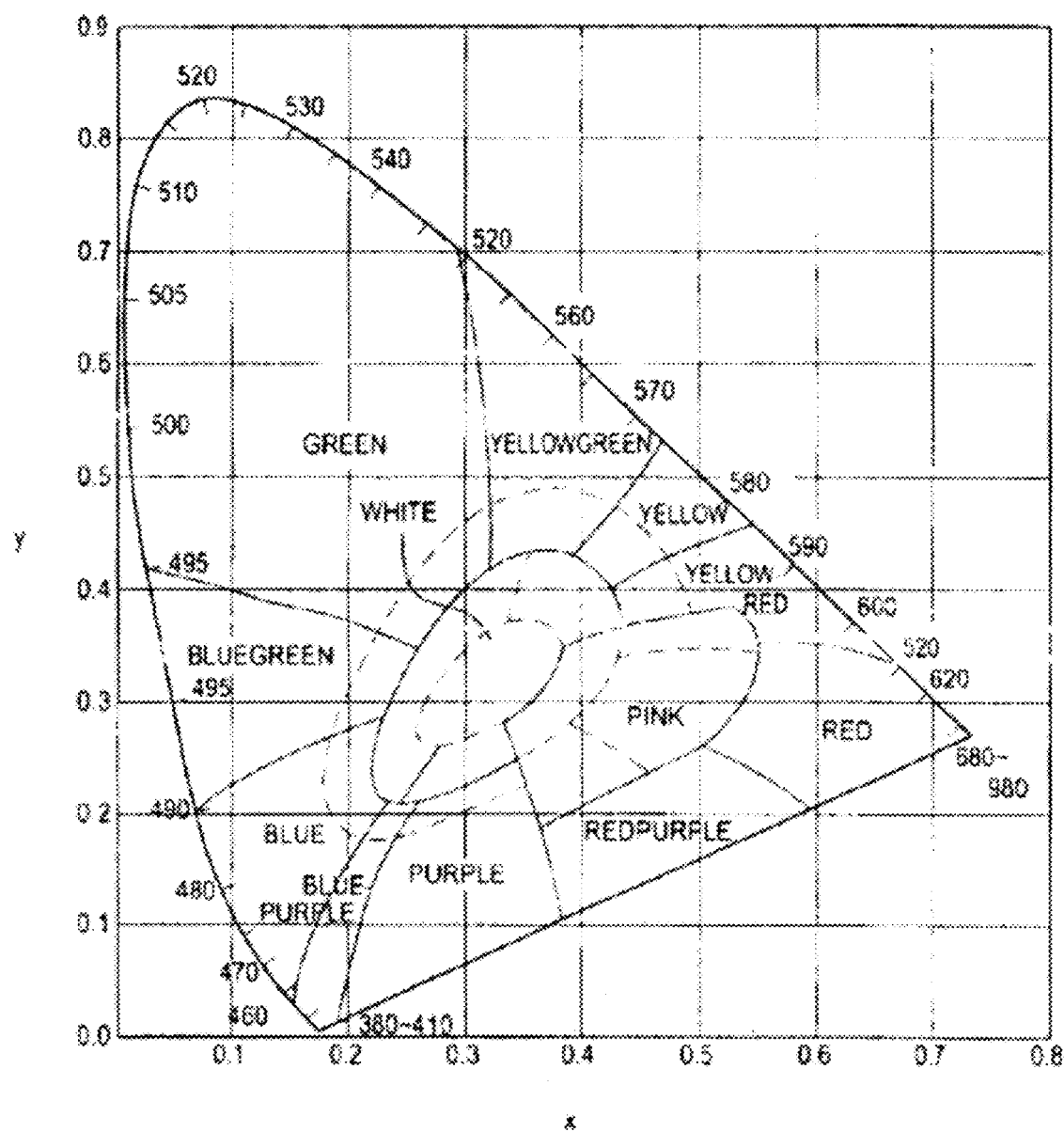
FIG. 2 is a chromaticity diagram of visible light.
Figure 3:
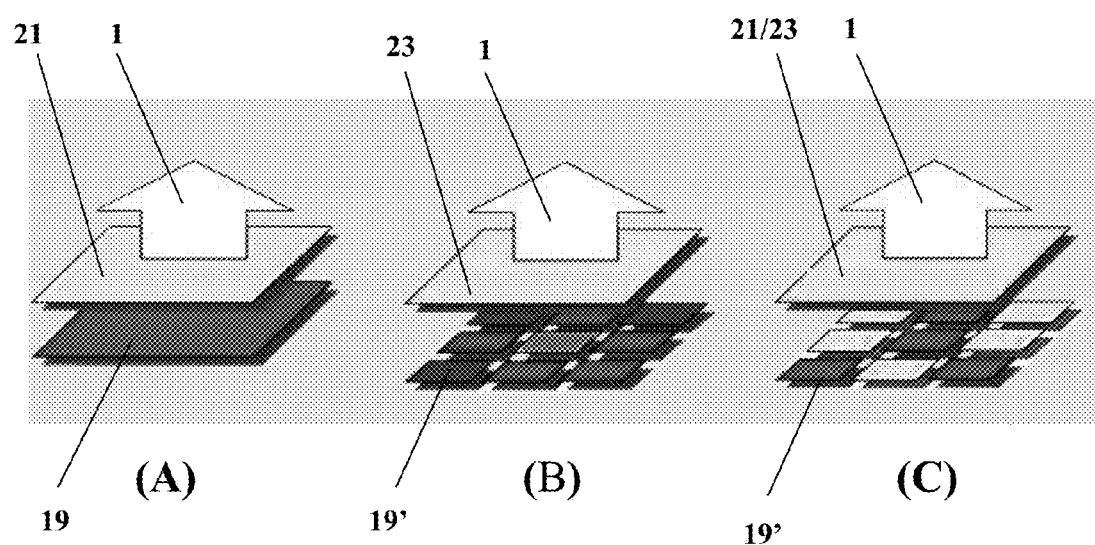
FIG. 3 illustrates differing exemplary prior art attempts of creating "white" light with LED devices.
Figure 7:
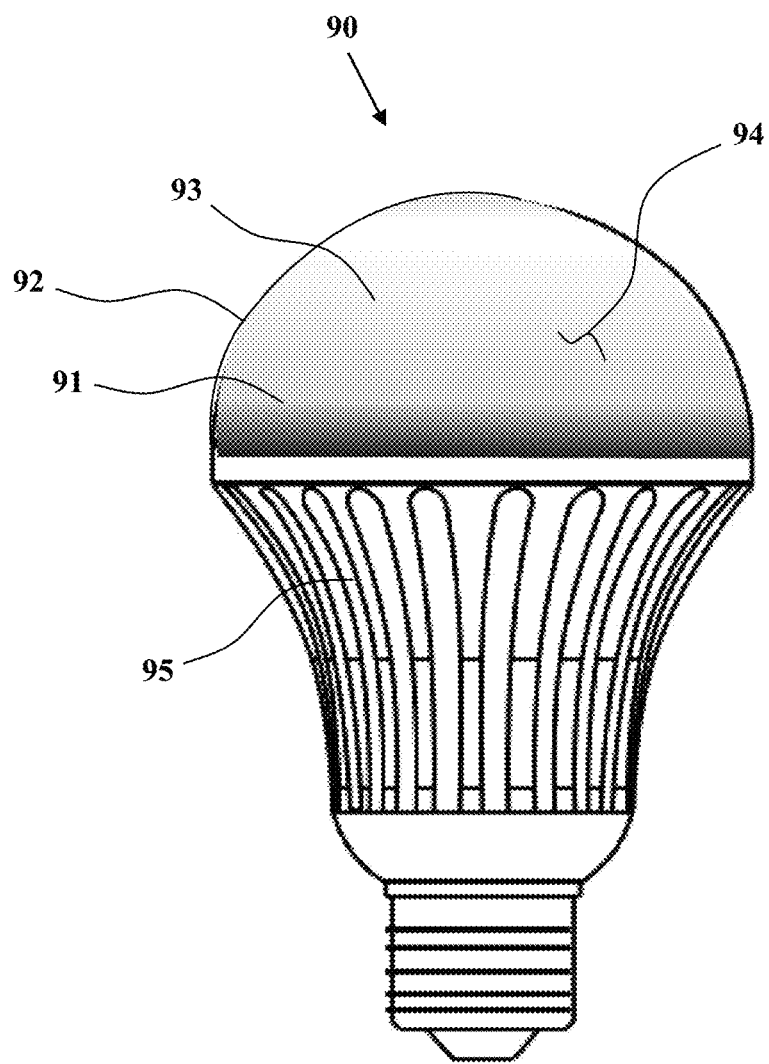
FIG. 7 illustrates a side view of an exemplary pigment application according to the method of treating or tuning an emission spectrum of FIG. 4.

In some embodiments, as shown in FIG. 7, the at least one pigment may be applied a light emitting source in an uneven or varying density. For example, as shown in FIG. 7 at least one pigment 94 may be applied to an envelope 92 of a light source 90 (however, as described above, the at least one pigment may be applied to any portion of a light source such that the at least one pigment tunes the spectrum of the source) in an uneven or varying density. As shown in FIG. 2, the light source 90 may include an envelope 92 including a first portion 91 proximate a base or head 95 of the light emitting source and a second portion 93 distal the base or head 95. In such an embodiment, for example, as shown in FIG. 7 the at least one pigment 94 may be applied to the light emitting source 90 in differing densities in the first and second portions 91, 93 thereof. For example, in some such embodiments, the at least one pigment 94 may be applied to the envelope 92 in a graduating density from a greater density in the first portion 91 of the envelope 92 to a lesser density in the second portion 93 of the envelope 92.

It is noted that a graduating density application of the at least one pigment 94 may have the advantageous effect of mimicking or replicating the color temperature, profile or light spectrum output of an incandescent light device that has been dimmed from "max" Wattage or output (i.e., as light intensity or irradiance diminishes). Specifically, the gradient or spatial differing applications of the at least one pigment 94 may allow for a darker appearing light or glow from the base of the source 90 as compared to the tip or end of the device 90. Further, such gradient or spatial differing application of the at least one pigment 94 may account for a differing degree of color or amount of light output by the source 90 device. Stated differently, differing at least one pigment 94 or amounts of at least one pigment 94 may be used to balance differing portions of the light being emitted by a source 90. For example, an LED device may output more light (or light of a shorter wavelength) through a first portion of the device's hood as compared to a second portion of the hood. In such a scenario, a higher density of the at least one pigment 94 or a differing at least one pigment 94 (e.g., at least one pigment 94 effective in adding longer wavelength light) may be applied to the first portion of the hood and a lower density of the at least one pigment 94 (i.e., less pigment) or a differing at least one pigment 94 (e.g., at least one pigment 94 effective in adding relatively less longer wavelength light) may be applied to the second portion of the hood. It is noted that the at least one pigment 94 may be applied to any type or shape of bulb, whether in the gradient density embodiment or otherwise, such as with globe-shaped source, tube-shaped source, flame tip-shaped source, etc.

Figure 8A:
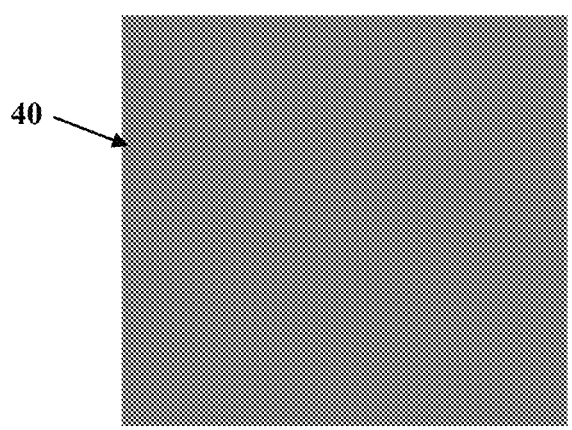
FIGS. 8A-C illustrates exemplary pigment applications according to the method of treating or tuning an emission spectrum of FIG. 4.
Figure 8B:
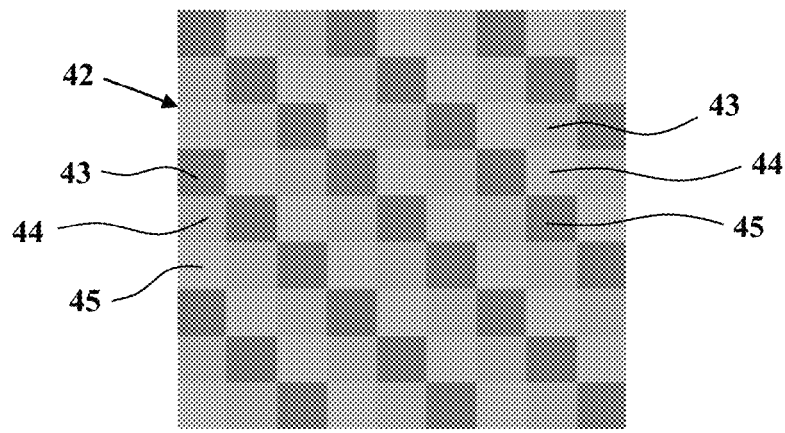
Figure 8C:
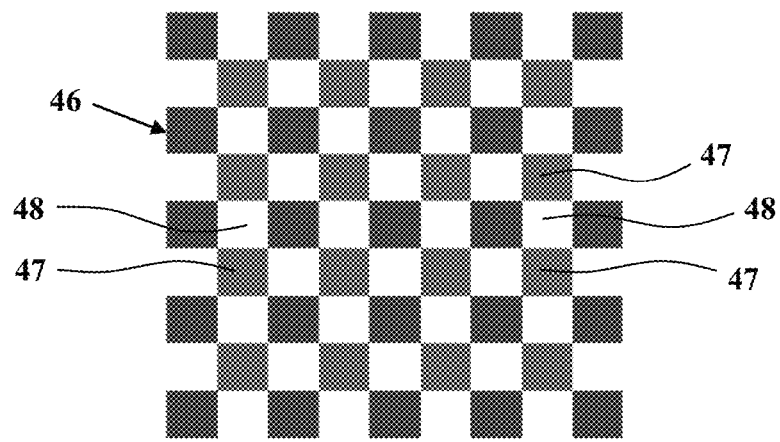

FIGS. 8A-C illustrate further exemplary applications of the at least one pigment to a light emitting source. As shown in FIGS. 8A-C, the at least one pigment may be applied to a light emitting source in a variety of patterns, schemes or configurations. Such patterns, schemes or configurations may be printed, sprayed, brushed or otherwise applied to one or more surface of a light emitting source, as explained further herein. In some exemplary embodiments, as shown in FIG. 8A, the at least one pigment may be applied as a single, solid transparent color pattern 40 such that the density of the at least one pigment 40 is substantially constant over the surface area of the at least one pigment 40. It is noted that the single, solid transparent color may be a mixture or blend of multiple pigments (i.e., pigments that absorb differing wavelengths).

Another at least one pigment pattern, scheme or configuration is shown in FIG. 8B. As shown in FIG. 8B, in some embodiments the at least one pigment may be applied in a pattern 42 of differing colors and/or densities. For example, the at least one pigment may be applied in a defined pattern 42 of differing colors and/or densities, such as a checkerboard-type pattern. As shown in FIG. 8B, the pattern 42 of differing colors and/or densities may include a discrete first pigment color and/or density 43, a discrete second pigment color and/or density 43 that differs from the first pigment color and/or density 44, and a discrete third pigment color and/or density 45 that differs from the first and second pigment colors and/or densities 43, 44. The first, second and third (and potentially further pigment colors and/or densities) pigment colors and/or densities 43, 44, 45 may be arranged in a defined pattern 42 such that the pattern remains substantially constant over a surface area of the light emitting source. The discrete pigment colors and/or densities may define any shape, such as square, rectangular, circular, triangular or any other shape or configuration. For example, differing pigment colors and/or densities may define a non-discrete random pattern or distribution.

Another at least one pigment pattern, scheme or configuration is shown in FIG. 8C. As shown in FIG. 8C, in some embodiments the at least one pigment may be applied in a pattern 46 of discrete at least one pigment portions 47 and discrete substantially pigment-free portions 48. For example, the at least one pigment may be applied in a defined pattern 46 of pigment portions 47 and pigment-free portions 48, such as a checkerboard-type pattern. As shown in FIG. 8C, the pigment-free portions 48 of the pattern 46 may allow for retention of luminosity while adding spectral wavelengths to the spectrum of the light source. While only three pigment FIGS. 8A-C patterns, schemes or configurations are shown in FIGS. 8A-C, as one of ordinary skill in the art would recognize an infinite variety of pigment patterns, schemes or configurations can be made using any combination of pigment colors, pigment densities, light interference additives, open spaces, etc.

In some embodiments, applying the at least one pigment to the light emitting source includes utilizing at least one vehicle binder and/or medium for the at least one pigment. In some embodiments, the at least one pigment is substantially contained within a binder. In some embodiments the binder includes at least one of a resin, polyresin, potassium and/or sodium silicate binder, acrylic polymer, oil-based binder, and water-based binder. In some embodiments, the binder and/or medium is/are substantially transparent. In some such embodiments, the substantially transparent binder and/or medium may be utilized to apply the at least one pigment to an interior surface or aspect of a light emitting source (e.g., within an LED dome), such as utilized to apply the at least one pigment to at least one filter, lens, pass-through surface, or the like. As another example, in some embodiments the substantially transparent binder and/or medium may be utilized to apply the at least one pigment to an exterior surface or aspect of a light emitting source, such as utilized to apply the at least one pigment to at least one exterior bulb surface.

In some embodiments, the binder and/or medium may be substantially translucent. In some such embodiments, the substantially translucent binder and/or medium may be utilized to apply the at least one pigment to reflective surfaces of the light source, such as reflective surfaces within the envelope or dome of the light source (e.g., and LED light source). In some embodiments, applying the at least one pigment to the light emitting source includes utilizing at least one resin-based vehicle binder and/or medium of the at least one pigment. In some such embodiments, the at least one resin-based vehicle binder and/or medium may be substantially transparent, humidity resistant, heat resistant (to normal operating temperatures of light sources) and may become substantially permanently bonded with glass, plastic and aluminum. In some embodiments, applying the at least one pigment to the light emitting source includes utilizing at least one silicate vehicle binder and/or medium of the at least one pigment. In some such embodiments, the at least one silicate vehicle binder and/or medium may be substantially transparent, humidity resistant, heat resistant (to normal operating temperatures of light sources) and may become substantially permanently bonded with glass and aluminum. In some embodiments, applying the at least one pigment to the light emitting source includes utilizing at least one glass frit vehicle binder and/or medium of the at least one pigment. In some such embodiments, the at least one glass frit vehicle binder and/or medium may be substantially transparent, humidity resistant, heat resistant (to normal operating temperatures of light sources) and may become substantially permanently bonded with glass.

In some embodiments, applying the at least one pigment to the light emitting source includes utilizing at least one polymers, oil-based and/or resin vehicle binder and/or medium for the at least one pigment that is varied with additional content/material or composition(s). For example, one or more binder and/or medium for the at least one pigment may include light-interfering additives, such as powdered mica and other crystalline stone to alter the color refraction and the light diffusion of the light emitted from the light source. In some embodiments, applying the at least one pigment to the light emitting source includes utilizing a least one polymers, oil-based and/or resin vehicle binder and/or medium for the at least one pigment altered such that the vehicle binder and/or medium is relatively highly glossy, semi-glossy or matte in finish. In some embodiments, applying the at least one pigment to the light emitting source includes utilizing a resin vehicle binder and/or medium and therma-bonding the resin vehicle binder and/or medium (and at least one pigment container therein) to one or more glass surface of the light source for permanent adhesion thereto. In some embodiments, applying the at least one pigment to the light emitting source includes utilizing a silicate vehicle binder and/or medium that provides for a permanent, chemical adhesion of the at least one pigment to any glass, stone or aluminum component, surface or aspects of the light source. In some such embodiments, after permanent, chemical adhesion via the silicate vehicle binder and/or medium the at least one pigment may be substantially impervious to heat, humidity, and handling of any kind.

In some embodiments, the method 10 of tuning a first emission spectrum of visible light emitted from a light emitting source with a first luminosity includes obtaining the spectral emission produced by the pigment-adjusted tuning of the light source (i.e., the spectral emission of the tuned light source). In some such embodiments, the method 10 of tuning a first emission spectrum of visible light emitted from a light emitting source may include further tuning the spectral and intensity (e.g., lux) output by rebalancing or selecting the at least one pigment (e.g., adjusting at least one of color, density, and application to the light source). Such analysis of the spectral emission of the tuned light source may be accomplished with the implementation of a computer program designed to read the first emission spectrum and produce the at least one pigment (e.g., color, density, and application to the light source) in order to achieve a final emission spectrum that is match the desired emission spectrum.

In some embodiments, the method 10 of tuning a first emission spectrum of visible light emitted from a light emitting source with a first luminosity includes generalizing a particular at least one pigment and light source embodiment (e.g., color, density, and application to the light source) to other light source that share the first emission spectrum (e.g., wavelength deficiency and/or excess). Such a generalized at least one pigment for a particular light source embodiment may be applied onto multiple aspects of the particular light source during the manufacturing process of the light source. In some such embodiments, the at least one pigment may be applied by screen printing, brushing, spraying or other manual application, or by photo duplicating the at least one pigment embodiment.

In some embodiments, the methods of tuning a first emission spectrum of visible light emitted from a light emitting source with a first luminosity with at least one pigment disclosed herein may be effective in tuning the light emitting source (such as, but not limited to, an LED lamp) such that the light emitted from the source includes a correlated color temperature (CCT) of less than about 3,500 K, more preferably less than about 3,250 K, even more preferably less than about 3,000 K, even more preferably less than about 2,900 K, even more preferably less than about 2,800 K, and even more preferably about within the range of about 2,860 K to about 2,650 K.

In some embodiments, the methods of tuning a first emission spectrum of visible light emitted from a light emitting source with a first luminosity with at least one pigment disclosed herein may be effective in tuning the light emitting source (such as, but not limited to, an LED lamp) such that the light emitted from the source includes a warm X-Y chromaticity indices. In some such embodiments, the X and Y chromaticity indices may be greater than about 0.295+/−0.015, more preferably be greater than about 0.32+/−0.015, and even more preferably be greater than about 0.38+/−0.015. In some embodiments, the X and Y chromaticity indices may be about 0.395+/−0.015.

In some embodiments, the methods of tuning a first emission spectrum of visible light emitted from a light emitting source with a first luminosity with at least one pigment disclosed herein may be effective in tuning the light emitting source (such as, but not limited to, an LED lamp) such that the light emitted from the source includes a color quality scale (CQS) of at least about 75, more preferably at least about 80, even more preferably at least about 85, even more preferably at least about 90, even more preferably at least about 95, even more preferably at least about 97, even more preferably at least about 98, even more preferably at least about 99, and even more preferably about 100.

In some embodiments, the methods of tuning a first emission spectrum of visible light emitted from a light emitting source with a first luminosity with at least one pigment disclosed herein may be effective in tuning the light emitting source (such as, but not limited to, an LED lamp) such that the light emitted from the source includes a color render index (CRI) of at least about 75, more preferably at least about 80, even more preferably at least about 85, even more preferably at least about 90, even more preferably at least about 95, even more preferably at least about 97, even more preferably at least about 98, even more preferably at least about 99, and even more preferably about 100.

In some embodiments, the methods of tuning a first emission spectrum of visible light emitted from a light emitting source with a first luminosity with at least one pigment disclosed herein may be effective in tuning the light emitting source (such as, but not limited to, an LED lamp) such that the light emitted from the source is a warmer visible light (as compared to the visible light emitted before the methods), mimicking the metameristic output of day light or traditional incandescent devices. In some such embodiments the first color rendering index (CRI) value and the first color quality scale (CQS) value may be increased as compared to the visible light emitted before the methods.

It is to be understood that the above description is intended to be illustrative, and not restrictive. Numerous changes and modifications may be made herein by one of ordinary skill in the art without departing from the general spirit and scope of the invention as defined by the following claims and the equivalents thereof. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Also, the term "operably" in conjunction with terms such as coupled, connected, joined, sealed or the like is used herein to refer to both connections resulting from separate, distinct components being directly or indirectly coupled and components being integrally formed (i.e., one-piece, integral or monolithic). Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of altering a first emission spectrum of visible light emitted from a light emitting source with a first luminosity, when energized, comprising:
   obtaining a first visible light emission spectrum emitted from a light emitting source including the intensity of wavelengths within the visible spectrum;
   determining a plurality of wavelengths of the first visible light emission spectrum with intensities less than that of a desired second visible light emission spectrum;
   selecting a plurality of differing substantially transparent pigments that are effective in increasing the intensity of the plurality of wavelengths when the first visible light emission spectrum is emitted through the transparent pigments; and
   applying the plurality of differing substantially transparent pigments to the light emitting source in a first density to alter the first emission spectrum of the light emitting source by increasing the intensity of the plurality of wavelengths.

2. The method of claim 1, wherein the first density of the plurality of differing substantially transparent pigments decreases the first luminosity of the light emitting source by less than about 25%.

3. The method of claim 1, wherein the plurality of wavelengths of the first visible light emission spectrum include at least one first wavelength that is greater than about 620 nanometers.

4. The method of claim 3, wherein the plurality of wavelengths of the first visible light emission spectrum include at least one second wavelength that is less than or equal to about 620 nanometers.

5. The method of claim 1, wherein the plurality of wavelengths of the first visible light emission spectrum include at least one range of wavelengths of the first visible light emission spectrum.

6. The method of claim 1, wherein the plurality of wavelengths of the first visible light emission spectrum includes at least two ranges of wavelengths of the first visible light emission spectrum.

7. The method of claim 6, wherein the plurality of differing substantially transparent pigments include at least a first pigment that is effective in increasing the intensity of light wavelengths within about one of the at least two ranges of wavelengths, and a second a pigment that is effective in increasing the intensity of light wavelengths within about the other of the at least two ranges of wavelengths.

8. The method of claim 1, wherein the plurality of differing substantially transparent pigments are contained within a binder.

9. The method of claim 8, wherein the binder includes at least one of a resin, polyresin, potassium and/or sodium silicate binder, acrylic polymer, oil-based binder, and water-based binder.

10. The method of claim 1, wherein the light emitting source is a solid state light emitting device.

11. The method of claim 10, wherein the solid state light emitting device includes a diode and a phosphor device or material, and wherein applying the plurality of differing substantially transparent pigments to the light emitting source includes at least one of:
    applying the plurality of differing substantially transparent pigments to an exterior surface of the phosphor device or material substantially opposing the interior surface thereof such that the phosphor device or material is positioned between the diode and the plurality of differing substantially transparent pigments.

12. The method of claim 10, wherein the solid state light emitting device includes a diode and an at least partially transparent envelope at least partially extending about the diode, and wherein applying the plurality of differing substantially transparent pigments to the light emitting source includes at least one of:
    applying the plurality of differing substantially transparent pigments to an interior surface of the envelope such that the plurality of differing substantially transparent pigments are positioned between the diode and the envelope; and
    applying the plurality of differing substantially transparent pigments to an exterior surface of the envelope substantially opposing the interior surface thereof such that the envelope is positioned between the diode and the plurality of differing substantially transparent pigments.

13. The method of claim 10, wherein the solid state light emitting device includes a diode and at least one reflector, and wherein applying the plurality of differing substantially transparent pigments to the light emitting source includes applying the plurality of differing substantially transparent pigments to an interior surface of the reflector such that the plurality of differing substantially transparent pigments are positioned between the diode and the reflector.

14. The method of claim 10, wherein the light emitting source includes an envelope including a first portion proximate a base or head of the light emitting source and a second portion distal the base or head, and wherein applying the plurality of differing substantially transparent pigments to the light emitting source includes applying the plurality of differing substantially transparent pigments to the envelope in differing densities in the first and second portions thereof.

15. The method of claim 14, wherein applying the plurality of differing substantially transparent pigments to the envelope includes applying the plurality of differing substantially transparent pigments to the envelope in a graduating density from a greater density in the first portion of the envelope to a lesser density in the second portion of the envelope.

16. The method of claim 10, wherein the solid state light emitting device includes a diode and at least one lens or filter, and wherein applying the plurality of differing substantially transparent pigments to the light emitting source includes at least one of:

applying the plurality of differing substantially transparent pigments to an interior surface of the at least one lens or filter so the plurality of differing substantially transparent pigments are positioned between the diode and the at least one lens or filter;

applying the plurality of differing substantially transparent pigments to an exterior surface of the at least one lens or filter substantially opposing the interior surface thereof such that the at least one lens or filter is positioned between the diode and the plurality of differing substantially transparent pigments; and positioning the plurality of differing substantially transparent pigments within the at least one lens or filter.

17. The method of claim 1, wherein applying the plurality of differing substantially transparent pigments to the light emitting source includes applying the plurality of differing substantially transparent pigments provided in a defined pattern of differing densities.

18. The method of claim 1, wherein the plurality of differing substantially transparent pigments applied to the light emitting source increases the color rendering index (CRI) value and the color quality scale (CQS) value of the visible light emitted by the light emitting source.

19. The method of claim 3, wherein the plurality of wavelengths of the first visible light emission spectrum include at least one second wavelength within the range of about 380 nanometers to about 550 nanometers.

20. The method of claim 1, wherein the transparent pigments are non-luminous.

* * * * *